(12) United States Patent
Hashimoto

(10) Patent No.: US 7,860,140 B2
(45) Date of Patent: Dec. 28, 2010

(54) LIGHT-EMITTING DEVICE WITH DOUBLE INTERMEDIATE LAYERS BETWEEN MESA STRIPE AND IRON-DOPED CURRENT BLOCKING LAYER

(75) Inventor: Jun-ichi Hashimoto, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 4 days.

(21) Appl. No.: 12/488,029

(22) Filed: Jun. 19, 2009

(65) Prior Publication Data
US 2009/0323749 A1 Dec. 31, 2009

(30) Foreign Application Priority Data
Jun. 30, 2008 (JP) ............................. 2008-171418

(51) Int. Cl.
*H01S 5/00* (2006.01)
(52) U.S. Cl. ............ 372/45.01; 372/43.01; 372/45.012; 372/46.01
(58) Field of Classification Search .............. 372/43.01, 372/45.01, 45.012
See application file for complete search history.

(56) References Cited
U.S. PATENT DOCUMENTS
2006/0017062 A1 * 1/2006 Hashimoto et al. .......... 257/103
2007/0091955 A1 * 4/2007 Takayama ................ 372/43.01

FOREIGN PATENT DOCUMENTS
JP 2-206192 8/1990
JP 9-214045 * 8/1997
JP 11-186666 7/1999
JP 2001-298240 10/2001

OTHER PUBLICATIONS

Nordell et al., "Movpe Regrowth of Semi-Insulating InP Around Reactive Ion Etched Laser Mesas", Electronic Letters, May 3, 1991, vol. 27, No. 11, pp. 926-927.
Matsumoto et al., "Highly reliable 1.55µm GaInAsP laser diodes buried . . . iron-doped InP", Electronic Letters, Aug. 4, 1994, vol. 30, No. 16, pp. 1350-1306.
Higashi et al., "High-Temperature CW Operation of InGaAsP-InP . . . Technique", IEE Photonics Technology Letters, vol. 7, No. 8, Aug. 1995, pp. 828-829.

* cited by examiner

*Primary Examiner*—Dung T Nguyen
(74) *Attorney, Agent, or Firm*—Smith, Gambrell & Russell, LLP

(57) ABSTRACT

A light-emitting device that reduces the leak current flowing along the sides of the mesa stripe is disclosed. The device provides the mesa stripe, the current blocking layer, and two intermediate layers put between the mesa stripe and the current blocking layer. One of intermediate layers has the p-type conduction and comes in directly contact with the mesa stripe, while, the other intermediate layer has the n-type conduction and put between the former intermediate layer and the current blocking layer. The double intermediate layers prevent impurities in the current blocking layer and in the mesa stripe from inter-diffusing each other.

11 Claims, 7 Drawing Sheets

LIGHT-EMITTING DEVICE WITH DOUBLE INTERMEDIATE LAYERS BETWEEN MESA STRIPE AND IRON-DOPED CURRENT BLOCKING LAYER

BACKGROUND OF THE INVENTION

1. Field of the Invention

The present invention relates to a semiconductor optical device, in particular, the invention relates to a semiconductor light-emitting device.

2. Related Background Art

One type of semiconductor laser diodes with the buried hetero-structure, hereafter denoted as BH, has been well known in the field of the optical communication system as an optical signal source. The BH structure buries the mesa stripe including the active layer by the current blocking layers made of a semiconductor material in both sides of the mesa stripe. The current blocking layer usually has bandgap energy greater than that of a semiconductor material for the active layer. Comparing this BH structure with other types of the semiconductor layer diode, such as ridge waveguide type, the BH structure efficiently concentrates the carriers injected from the electrodes and also the light within the active layer, which may enhance the emission efficiency.

FIG. 6 shows an example of the BH structure. The laser diode, hereafter denoted as LD, 56 shown in FIG. 6 provides the mesa stripe between the cathode 101 and the anode 112. The mesa stripe includes the n-type lower cladding layer 103, the active layer 105, the p-type upper cladding layer 107, and the p-type contact layer 108 on the n-type semiconductor substrate 102. The current blocking layer 109 buries the mesa stripe in both sides thereof. The current blocking layer 109 is often doped with impurities that cause deep levels in the energy bandgap, typically, irons (Fe) are applied as the impurities. The deep levels may capture electrons and/or holes; accordingly, the current blocking layer 109 may operate as a semi-insulating layer. Because such a current blocking layer with the semi-insulating characteristics may reduce the parasitic capacitance of the LD 56, comparing with another type of the current blocking layer with the reversed biased p-n junction, the LD may operate in high frequencies over 10 GHz.

Several prior arts have reported the LD with the BH structure that provides the current blocking layer for burying the mesa stripe and doped with irons (Fe). It is also well known that impurities doped in the current blocking layer and other impurities doped in layers adjacent to the current blocking layer easily inter-diffuse. In particular, irons in the current blocking layer and zincs in the p-type cladding layer easily cause the inter-diffusion, in which the current blocking layer inter-diffused with Zn from the p-type cladding layer and provided with holes decreases its resistivity; while, the p-type cladding layer inter-diffused with Fe from the current blocking layer, which forms the deep levels to capture the carriers, increases its resistivity. Thus, the inter-diffusion of impurities degrades the current injection efficiency into the active layer in the mesa stripe, which increases the threshold current and decreases the emission efficiency of the laser emission.

Deep levels in the semiconductor layer generally capture only one of carriers, electrons or holes, that is, the semiconductor layer with the deep level generally shows the insulating characteristic only for one of the carriers. For instance, the current blocking layer doped with Fe can capture the electron but the hole; such a layer may show the high resistivity only for the electron. Therefore, when the Fe-doped layer comes in directly contact with a p-type layer, the electrons captured in the deep level in the Fe-doped layer and the holes diffused from the adjacent p-type layer and not captured by the deep level may easily recombine in the Fe-doped layer, which causes the leak current. Thus, the leak current flowing outside of the active layer reduces the carrier injection efficiency into the active layer, which degrades the device performance in, for instance, the threshold current and the slope efficiency.

One type of the LD 57, whose layer structure is illustrated in FIG. 7, provides a supplemental InP layer 111 with the n-type conduction in addition to the layers shown in FIG. 6 between the current blocking layer 119 doped with Fe and the cladding layer 117 doped with Zn. This additional layer 111 may suppress the inter-diffusion of Fe and Zn. This n-type InP layer 111 prevents the hole from injecting from the cladding layer 117 into the current blocking layer 119, which operates as a hole-capturing layer. Accordingly, the layer structure shown in FIG. 7 may effectively suppress the device performance due to the leak current by the inter-diffusion of impurities.

However, the active layer 105 shown in FIG. 7 comes in directly contact with the n-type additional layer 111, which permits the leak current flowing in the n-type additional layer 111 in both sides of the active layer 105. This leak current is due to the electrons, and because the electron shows a light effective mass, which is equivalent to a large mobility; the leak current tends to be large. Thus, even the layer structure shown in FIG. 7 is not enough to suppress the degradation of the device performance, such as the increase of the threshold current and the decrease of the slope efficiency.

SUMMARY OF THE INVENTION

The present invention relates to a semiconductor light-emitting device that comprises, on a semiconductor substrate, a mesa stripe, a current blocking layer in both sides of the mesa stripe so as to bury the mesa stripe. A feature of the present invention is that a p-type intermediate layer in addition to the n-type intermediate layer is provided between the mesa stripe and the current blocking layer so as to come in directly contact with the side of the mesa stripe. The n-type intermediate layer is put between the p-type intermediate layer and the current blocking layer, and does not come in directly contact with the mesa stripe.

The p-type intermediate layer may prevent the electrons from propagating from the first cladding layer or the second cladding layer to the n-type intermediate layer, which may reduce or substantially remove the leak current flowing in the n-type intermediate layer. Although the holes may seep out from the first or the second cladding layer into the p-type intermediate layer, the leak current due to the holes becomes far less than the leak current due to the electrons because the effective mass of the hole is at least one digit greater than that of the electron. Thus, because of the decrease of the leak current flowing along the sides of the mesa stripe, degradation of the device performance, such as the increase of the threshold current and the decrease of the slope efficiency of the laser emission, may be suppressed.

BRIEF DESCRIPTION OF DRAWINGS

The invention will be described in conjunction with the accompanying drawings, in which.

DETAILED DESCRIPTION OF PREFERRED EMBODIMENTS

Next, embodiments according to the present invention will be described as referring to accompanying drawings. In the description of the drawings, the same numeral or the same symbol will refer to the same element without overlapping explanations.

First Embodiment

Figure 1:
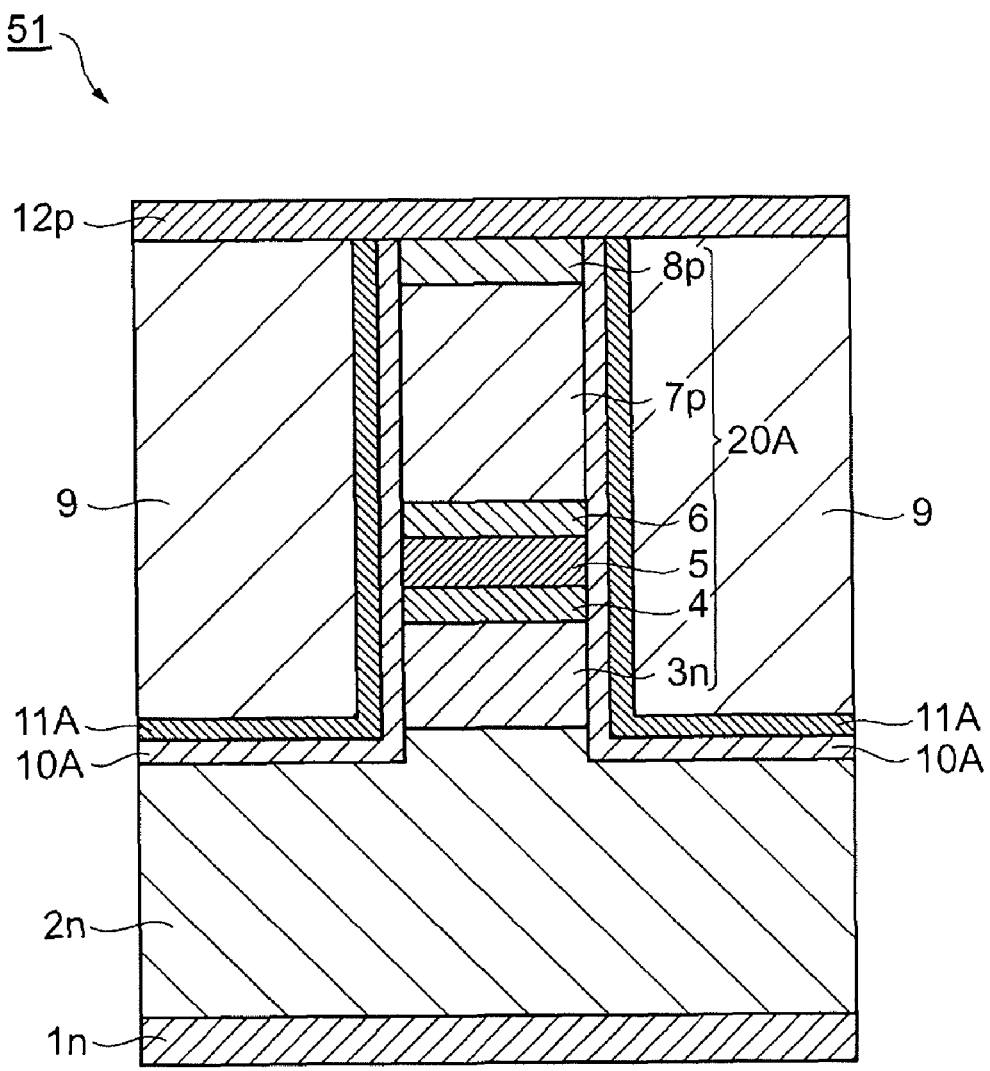
FIG. 1 schematically illustrates the cross section of the light-emitting device according to the first embodiment of the present invention.

FIG. 1 schematically illustrates the cross section of the semiconductor light-emitting device 51. This light-emitting device 51 is the Fabry-Perot LD with the BH structure. The LD 51 provides the cathode 1n, the n-type semiconductor substrate 2n, the mesa stripe 20A, the current blocking layer 9, the p-type intermediate layer 10A, the n-type intermediate layer 11A, and the anode 12p. The mesa stripe 20A includes the n-type lower cladding layer 3n, the lower optical confinement layer 4, the active layer 5, the upper optical confinement layer 6, the upper p-type cladding layer 7p and the p-type contact layer 8p.

The n-type substrate 2n may be made of n-type InP. The active layer 5, which is formed on the n-type lower cladding layer 3n, may have the quantum well structure with a plurality of well layers and a plurality of barrier layers alternately stacked with each other. The well layer and the barrier layer may 5 be made of GaInAsP, GaInAs, AlGaInAs and/or AlInAs. The active layer may be free from the impurities, the un-doped active layer, to reduce the optical absorption loss, but may be doped with the p-type impurities or the n-type impurities. An exemplary condition for the active layer 5 is that both the well layers and the barrier layers are made of un-doped GaInAsP.

The n-type lower cladding layer 3n, which is formed on the n-type substrate 2n, operates as the first cladding layer; while, the p-type upper cladding layer 7p, which is formed on the active layer 5, operates as the second cladding layer. An InP doped with respective impurities is generally applicable to these cladding layers, 3n and 7p; but other semiconductor materials such as GaInAsP, GaInAs, AlGaInAs, or AlInAs is also applicable to the cladding layers, 3n and 7p. The cladding layers, 3n and 7p, preferably has the bandgap energy greater than that of the active layer 5 and the optical confinement layers, 4 and 6, which will be described below, in order to enhance the carrier injection efficiency within the active layer.

The lower optical confinement layer 4 is put between the lower cladding layer 3n and the active layer 5; while the upper optical confinement layer 6 is put between the active layer 5 and the upper cladding layer 7p. These upper and lower optical confinement layers, 4 and 6, may be made of same semiconductor material with that applicable to the active layer. The optical confinement layers, 4 and 6, are generally un-doped to reduce the optical absorption loss; but, if necessary, they may be doped with p-type or n-type impurities. A typical example for the optical confinement layers, 4 and 6, are the un-doped GaInAsP.

The lower optical confinement layer 4 preferably has the bandgap energy smaller than that of the n-type lower cladding layer 3n and greater than that of the active layer 5. Similarly, the upper optical confinement layer 6 preferably has the bandgap energy smaller than the p-type upper cladding layer 7p and greater than the active layer. This configuration in the bandgap energy may efficiently inject carriers from the n-type lower cladding layer 3n, which are the electron, and other carriers from the p-type cladding layer 7p, which are the hole, into the active layer 5 without being blocked in respective optical confinement layers, 4 and 6.

Moreover, under the condition of the bandgap energy described above between the active layer, the optical confinement layer and the cladding layer, the lower optical confinement layer 4 preferably has the refractive index greater than that of the n-type lower cladding layer 3n and smaller than that of the active layer 5; while the upper optical confinement layer 6 preferably has the refractive index greater than that of the p-type upper cladding layer 7p and smaller than that of the active layer 5. Under such a condition of the refractive indices of respective layers, the light generated in the active layer 5 may be effectively confined within the upper and the lower optical confinement layers, 4 and 6, and also in the active layer 5. Thus, the layer structure of the cladding layers, 3n and 7p, the optical confinement layers, 4 and 6, and the active layer 5 are often called as the separate confinement heterostructure (SCH) structure.

The LD 51 with the SCH structure may improve the emission characteristic and the temperature dependence thereof because the optical confinement within the active layer 5 may be performed without affecting or reducing the carrier confinement within the active layer 5. In particular, when the LD has a thin active layer 5, even it provides the quantum well structure; the LD would be hard to show the laser emission because of the insufficient optical confinement in the active layer 5. The optical confinement layers, 4 and 6, provided so as to enhance the optical confinement within the active layer 5 may realize the laser emission with an improved performance in the emission itself and the temperature dependence thereof. When the active layer 5 has a type of the bulk structure with an enough thickness, the optical confinement layers, 4 and 6, become unnecessary.

The current blocking layer 9 is formed so as to put the mesa stripe 20A therebetween and to bury the mesa stripe 20A. The current blocking layer 9 is often made of InP but not restricted to InP. Other semiconductor materials, such as GaInAsP, GaInAs, AlGaInAs, and/or AlInAs are also applicable to the current blocking layer 9.

The current blocking layer 9, in order to increase the resistivity thereof, contains impurities to cause deep levels that capture at least one of the electron and the hole. Such an impurity makes the current blocking layer 9 semi-insulating with the resistivity exceeding $10^8$ Ωcm. Irons (Fe) are well known as the dopant to make the layer semi-insulating; but the dopant is not restricted to Fe. Transition metals such as titanium (Ti), chromium (Cr), and cobalt (Co) are replaceable to iron (Fe).

The p-type contact layer 8p, which is provided on the p-type upper cladding layer 7p, secures the ohmic contact with the anode 12p. The p-type contact layer may be made of heavily doped p-type GaInAsP and/or heavily doped p-type GaInAs. The cathode 1n and the anode 12p are provided for supplying carriers in the mesa stripe 20A. The anode 12p is provided on the p-type contact layer 8p; while, the cathode in is on the back surface of the n-type substrate 2n.

Tow intermediate layers, 10A and 11A, are provided between the mesa stripe 20A and the current blocking layer 9. The former intermediate layer 10A, which is the p-type layer, comes in contact with the sides of the mesa stripe 20A; while, the latter intermediate layer 11A with the n-type characteristic, which is put between the p-type intermediate layer 10A and the current blocking layer 9, comes in contact with the blocking layer 9. These two intermediate layers, 10A and 11A, may be made of, as those of the active layer 5 and the optical confinement layers, 4 and 6, InP, GaInAsP, GaInAs, AlGaInAs and/or AlInAs. The current blocking layer 9, the p-type intermediate layer 10A and the n-type intermediate layer 11A preferably have the bandgap energy greater than that of the active layer 5. This preferable condition in the bandgap energy forms a hetero-barrier between the active layer 5 and the peripheral layers, 9, 10A and 11A, that enhances the carrier confinement within the active layer 5. Moreover, because the layer arrangement above described between the active layer 5 and the peripheral layers, 9, 10A and 11A, forms the distribution of the refractive indices, that is, the refractive index of the active layer 5 is highest with respect to the peripheral layers, 9, 10A and 11A; the optical confinement within the active layer 5 may be also enhanced which increases the emission efficiency of the light-emitting device 51.

Because InP has the largest bandgap energy among GaInAsP materials lattice-matched with InP, InP forms the highest hetero-barrier against the active layer 5 when it is applied to the n-type and p-type intermediate layers, 10A and 11A, and the current blocking layer 9. Moreover, InP shows the smallest refractive index among InGaAsP material lattice-matched with InP; accordingly, the intermediate layers, 10A and 11A, and the current blocking layer 9 both made of InP may effectively confine the light within the active layer 5.

Still further, because InP does not contain aluminum (Al), which is secure for the oxidization, and is binary compound material, the grown InP layer may be maintained in stable, specifically, the lattice constant of the grown layer does not deviate from the lattice-matched condition even when the InP is grown on an area with steps in the sides of the mesa stripe 20A. Therefore, the intermediate layers, 10A and 11A, and the current blocking layer 9, each made of InP may be re-grown keeping with good crystal quality, which results in a superior emission characteristic of the light-emitting device 51. Zinc (Zn) is applicable for the p-type dopant in the p-type intermediate layer 10A; while, sulfur (S) and silicon (Si) are well known as the n-type dopant in the n-type intermediate layer 11A.

Summarizing the function and the way of the light-emitting device 51 according to the present embodiment of the invention: First, the n-type intermediate layer 11A may prevent irons (Fe) contained in the current blocking layer 9 and dopants in the p-type upper cladding layer 7p, such as zinc (Zn), from inter-diffusing with each other, and, at the same time, may operate as a hole-capturing layer to prevent the hole from invading into the current blocking layer 9 from the p-type upper cladding layer 7p. While, the p-type intermediate layer 10A provided between the n-type intermediate layer 11A and the mesa stripe 20A may operate as a barrier for electrons propagating from the n-type lower cladding layer 3n and the n-type substrate 2n to the n-type intermediate layer 11A, because the p-type intermediate layer 10A and the n-type intermediate layer 11A forms a reversely biased pn-junction therebetween. Therefore, the n-type intermediate layer 11A causes almost no leak current flowing therein. On the other hand, the p-type intermediate layer 10A has a possibility to cause a leak current due to holes propagated from the p-type upper cladding layer 7p and the p-type contact layer 8p. Because the effective mass of the hole is much larger than that of the electron, at least one digit larger than the electron effective mass, the leak current due to the hole propagation is at least one digit smaller than the leak current due to the electron. Thus, the leak current flowing in both sides of the active layer may be reduced at least one digit compared with the conventional device where the n-type intermediate layer directly comes in contact with the mesa stripe. The increase of the threshold current and the degradation of the slope efficiency, in other words, the emission efficiency, may be effectively improved in the light-emitting device according to the present embodiment of the invention.

The pn-junction, which is formed between the n-type intermediate layer 11A and the p-type intermediate layer 10A, may probably degrade the high-speed performance of the device due to the parasitic capacitance of the pn-junction. However, the p-type intermediate layer 10A is thin enough, for instance, around 200 nm in the present embodiment and it is preferably applicable from 50 to 1000 nm, to be negligible for that of the current blocking layer 9 typical thicknesses of which is around 5 to 6 µm. That is, because the volume of the p-type intermediate layer 10A is far smaller than that of the current blocking layer 9, the amount of the space charges in the p-type intermediate layer 10A becomes negligible compared with the space charges in the blocking layer 9, which is equivalent to substantially no contribution to the parasitic capacitance and makes substantially no influence on the high frequency performance of the light-emitting device 51.

Figure 6:
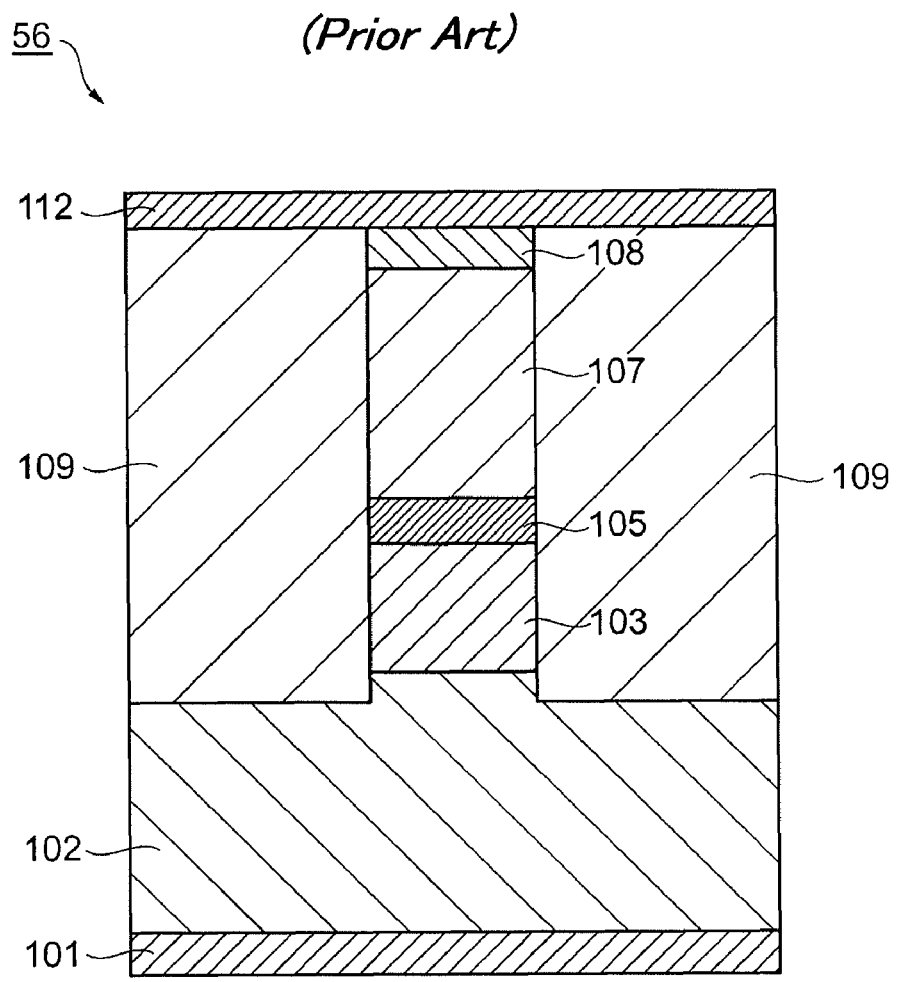
FIG. 6 shows the cross section of the light-emitting device having a conventional layer structure.
Figure 7:
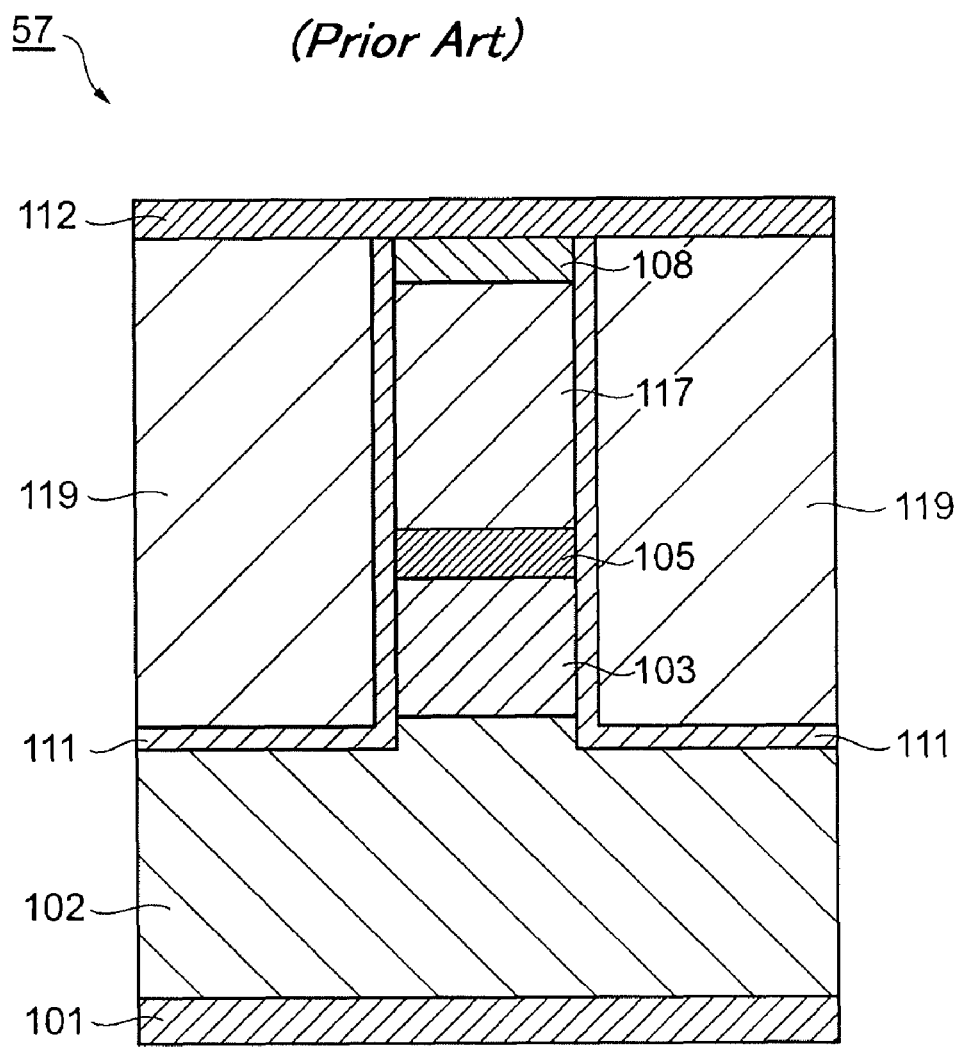
FIG. 7 shows the cross section of the other light-emitting device having still another conventional layer structure.

When the current blocking layer is doped with Fe, the conventional layer structure without any intermediate layers illustrated in FIG. 6 easily causes the inter-diffusion between Fe in the current blocking layer and impurities, for instance Zn, in the p-type layers in the mesa stripe. Accordingly, an intermediate layer 111 is provided between the mesa stripe and the current blocking layer 119 as illustrated in FIG. 7. However, this intermediate layer in FIG. 7, as described above, easily causes a leak current. On the other hand, the light-emitting device 51 according to the present invention effectively reduces the leak current flowing in both sides of the mesa stripe. The increase of the threshold current and the degradation of the slope efficiency may be effectively prevented. The intermediate layers, 10A and 11A, of the present embodiment may be also applicable to the current blocking layer 9 doped with titanium (Ti), chromium (Cr) and/or cobalt (Co), not restricted to the blocking layer doped with iron (Fe).

Next, a process to manufacture the light-emitting device 51 shown in FIG. 1 will be described as referring to FIGS. 2A to 2D. The OMVPE (Organic Metal Vapor Phase Epitaxy) technique may be used for the growth of the semiconductor layers.

Figure 2A:
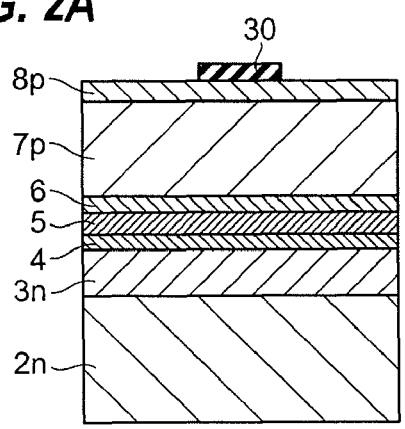
FIGS. 2A to 2D show processes to form the light-emitting device illustrated in FIG. 1.

First, a series of the semiconductor layers that includes the n-type lower cladding layer 3n, the lower optical confinement layer 4, the active layer 5, the upper optical confinement layer 6, the p-type cladding layer 7p, and the p-type contact layer 8p, is epitaxially grown on the n-type semiconductor substrate 2n, as illustrated in FIG. 2A. Subsequently, the process forms the dielectric mask 30 with a stripe pattern 30 for forming the mesa stripe 20A. The dielectric mask 30 may be made of silicon nitride (SiN) and/or silicon oxide ($SiO_2$).

Figure 2B:
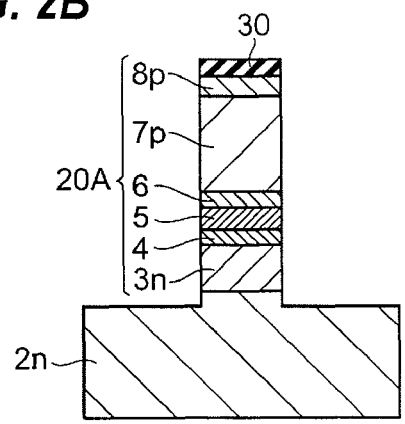

Next, the dry-etching or the wet-etching etches and removes a region not covered with the dielectric mask 30 until the n-type semiconductor substrate 2n exposes, or a surface portion of the n-type semiconductor substrate 2n is also removed, to form the mesa stripe 20A, as shown in FIG. 2B.

However, the exposure of the substrate 2n is not always necessarily; the etching may leave a portion of the n-type lower cladding layer 3n.

Figure 2C:
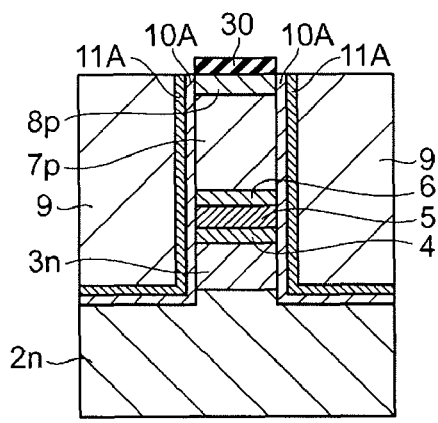
Figure 2D:
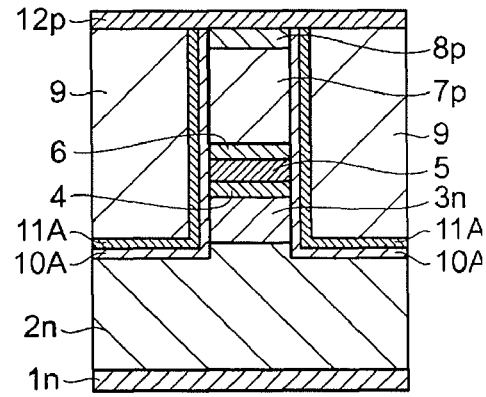

The second growth of the layers, the p-type and the n-type intermediate layers, 10A and 11A, is carried out so as to cover the side of the mesa stripe 20A and the exposed semiconductor substrate 2n as the dielectric mask 30 is left on the mesa stripe 20A. Subsequently, the current blocking layer 9 is successively grown so as to bury the mesa stripe 20A, as illustrated in FIG. 2C. Removing the dielectric mask 30 and thinning the semiconductor substrate 2n to a thickness where the substrate is able to be securely cleaved, for instance below 100 μm, by the polishing and/or the grinding, the cathode 1n and the anode 12p are formed on the back surface of the substrate 2n and the contact layer 8p, respectively. Thus, the LD 51 with the BH structure is completed, as illustrate in FIG. 2D.

The process described above comprises two steps of the growth of the semiconductor layers. The first growth completely follows the conventional process; while, the second growth includes additional steps to grow the mediate layers, 10A and 11A, in advance to the growth of the current blocking layer 9. However, the growth of the current blocking layer 9 may be successively carried out after the growth of the intermediate layers, 10A and 11A, that is, no process step is necessary to be performed between two growths, the process according to the present invention may almost follow the conventional process.

Figure 3:
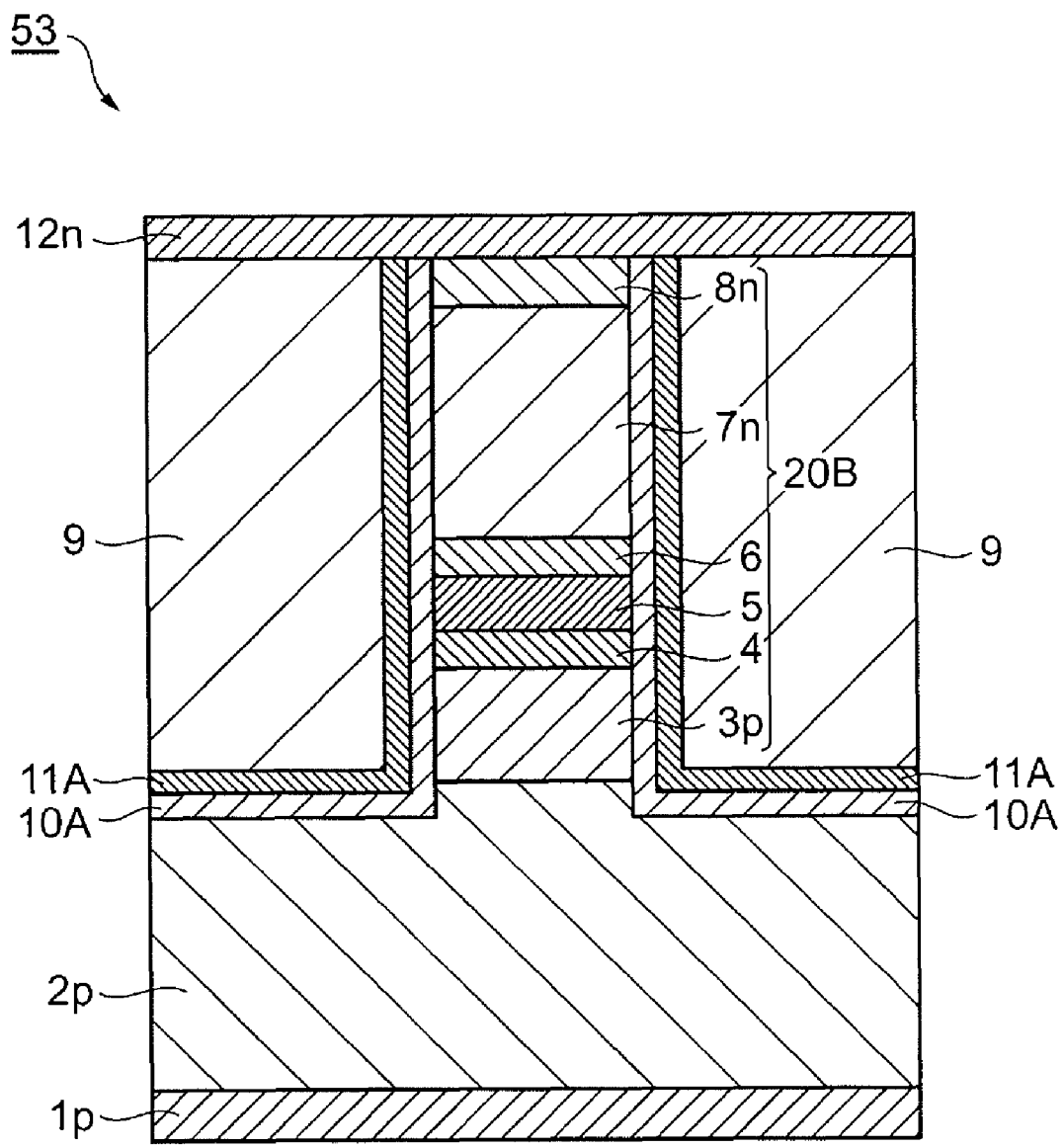
FIG. 3 schematically illustrates the cross section of the light-emitting device slightly modified from the device illustrated in FIG. 1.

The present invention is thus described by referring to the preferred embodiment illustrated in FIGS. 1 and 2. However, the invention is not restricted those embodiments, and a light-emitting device with the similar layer structure may be formed on a p-type semiconductor substrate. FIG. 3 schematically illustrates an exemplary cross section of a light-emitting device 53 formed on the p-type semiconductor substrate 2p. The device 53 in FIG. 3 reverses the conduction type of the upper and the lower cladding layers, the contact layer, and respective electrodes of the cathode and the anode compared with the former structure illustrated in FIG. 1 according to replacement of the semiconductor substrate. Other structures of the light-emitting device 53 in FIG. 3 follow the structure of the former device 51 shown in FIG. 1.

The light-emitting device 53 also provides, between two electrodes of the anode 1p and the cathode 12n, the mesa tripe 20B, the current blocking layer 9, the p-type intermediate layer 10A and the n-type intermediate layer 11A on the p-type semiconductor substrate 2p. The mesa stripe 20B includes, from the lower side to the upper side, the p-type lower cladding layer 3p, the lower optical confinement layer 4, the active layer 5, the upper optical confinement layer 6, the n-type upper cladding layer 7n and the n-type contact layer 8n.

Two intermediate layers, 10A and 11A, are put between the mesa stripe 20B and the current blocking layer 9; specifically, the p-type intermediate layer 10A comes in directly contact with the sides of the mesa stripe 20B, while, the n-type intermediate layer 11A comes in directly contact with the p-type intermediate layer 10A and the current blocking layer 9.

The light-emitting device 53 may reduce the leak current flowing in both sides of the mesa stripe 20B by at least one digit compared with the conventional device without double intermediate layers, 10A and 11B, by the same function described previously; accordingly, the light-emitting device 53 may suppress the degradation in the device performance such as the threshold current and the slope efficiency for the laser emission due to the reduction of the current injection efficiency.

Second Embodiment

Figure 4:
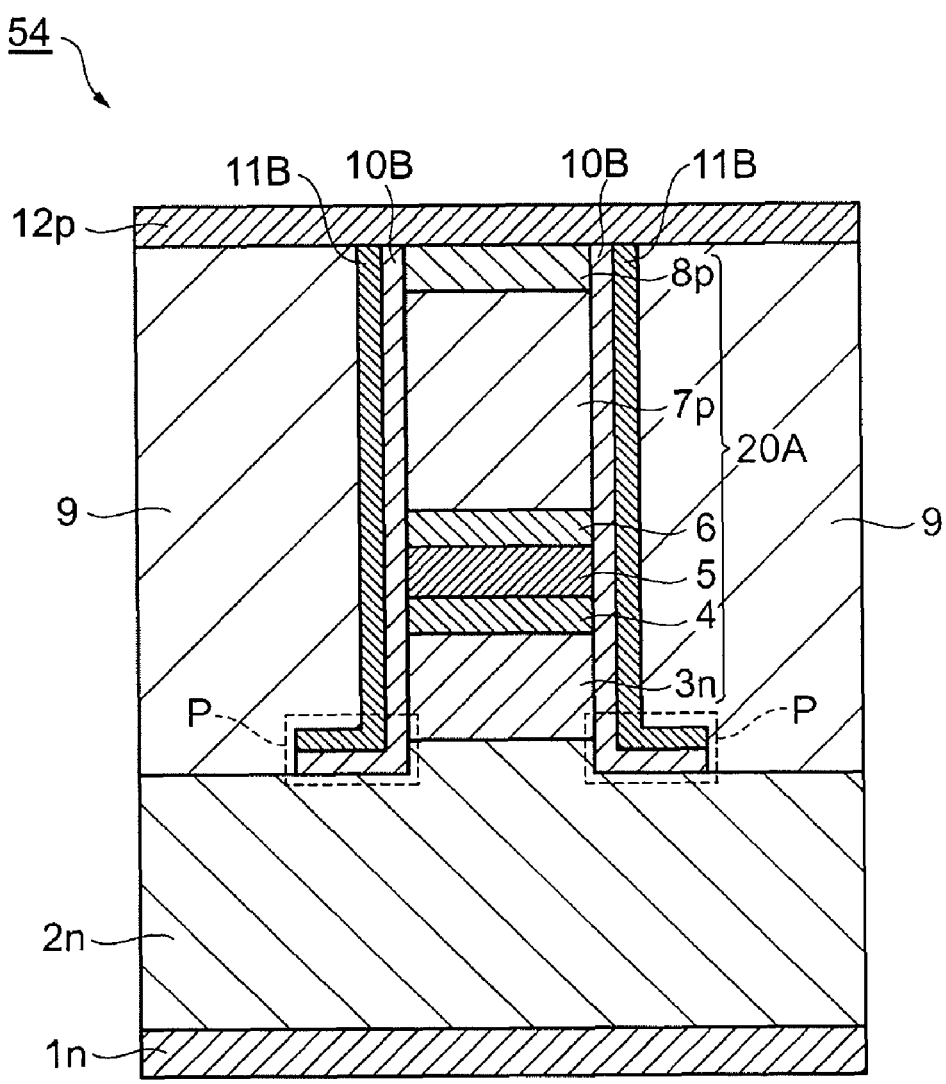
FIG. 4 schematically illustrates the cross section of another light-emitting device according to the second embodiment of the invention.

Next, the second embodiment according to the present invention will be described. FIG. 4 schematically illustrates a cross section of a light-emitting device 54 according to the second embodiment of the invention. The device 54 comprises the cathode 1n, the n-type semiconductor substrate 2n, the mesa stripe 20A, the current blocking layer 9, the p-type intermediate layer 10B, the n-type intermediate layer 11B, and the anode 12p. The mesa stripe 20A, similar to the former device 51 includes, from the lower to the upper, the n-type lower cladding layer 3n, the lower optical confinement layer 4, the active layer 5, the upper optical confinement layer 6, the p-type upper cladding layer 7p and the p-type contact layer 8p. Only two intermediate layers, 10B and 11B, have arrangements different from those, 10A and 11A, appeared in the first embodiment shown in FIG. 1.

The p-type and the n-type intermediate layers, 10B and 11B, are put between the mesa stripe 20A and the current blocking layer 9. Specifically, the p-type intermediate layer 10B comes in directly contact with the sides of the mesa stripe 20A, while, the n-type intermediate layer 11B is put between the p-type intermediate layer 10B and the current blocking layer 9. Moreover, two intermediate layers, 10B and 11B, partially covers the n-type semiconductor substrate 2n in an area P adjoining to the mesa stripe 20A. That is, the current blocking layer 9 partially comes in directly contact with the n-type substrate 2n.

Because the light-emitting device 54 shown in FIG. 4 covers the sides of the mesa stripe 20A with the p-type intermediate layer 10B, the leak current flowing along the sides of the mesa stripe 20A may be reduced by at least one digit compared with the device having the conventional layer structure without the p-type intermediate layer according to the same function already described above. Thus, the degradation in the device performance, such as the increase of the threshold current and the decrease of the slope efficiency, may be also suppressed in the light-emitting device 54.

Moreover, the former light-emitting device 51 provides the layer arrangement of two intermediate layers, 10A and 11A, which results in a slight increase of the parasitic capacitance of the device 51. The layer arrangement of the present embodiment, where two intermediate layers, 10B and 11B, only cover a narrower portion P adjacent to the mesa stripe 20A on the n-type substrate 2n, may effectively suppress the increase of the parasitic capacitance, which results in an excellent high frequency performance of the device 53.

Next, a process to manufacture the light-emitting device 54 will be described as referring to FIGS. 5A to 5E. First, semiconductor layers from the n-type lower cladding layer 3n to the p-type contact layer 8p are sequentially and epitaxially grown on the n-type semiconductor substrate 2n by the OMVPE technique. Subsequently, patterning the dielectric mask 30 in a stripe, removing the semiconductor layers not covered with the dielectric mask 30 so as to form the mesa stripe 20A, and secondly growing the p-type and the n-type intermediate layers, 10A and 11A, on both sides of the mesa stripe 20A and the exposed surface of the n-type substrate 2n, the process forms an intermediate product shown in FIG. 5B, which is the same intermediate product with the first embodiment.

Figure 5A:
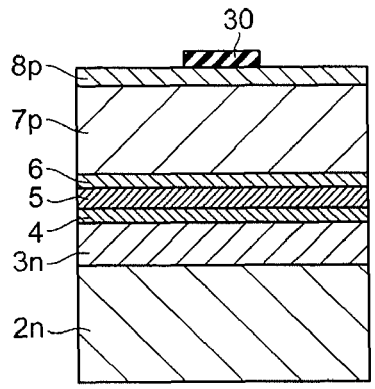
FIGS. 5A to 5E show processes to from the light-emitting device illustrated in FIG. 4.
Figure 5B:
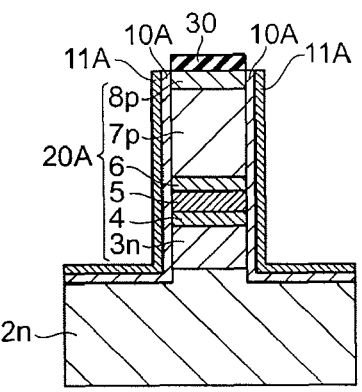
Figure 5C:
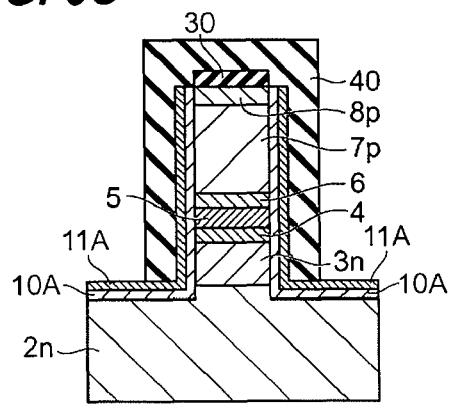

The process subsequently covers the dielectric mask 30, the mesa stripe 20A and a portion P of two intermediate layers, 10A and 11A, adjacent to the mesa stripe 20A by another mask 40 made of, for instance, photoresist, as illustrated in FIG. 5C, and removes another portion of the intermediate layers, 10A and 10B, not covered with the mask 40 by etching.

Figure 5D:
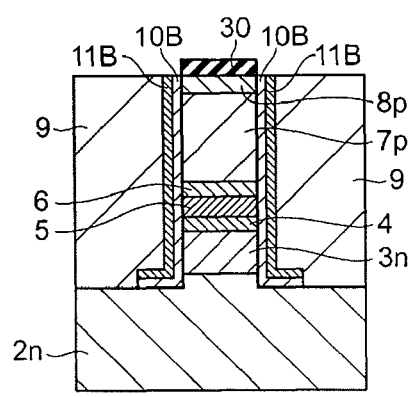
Figure 5E:
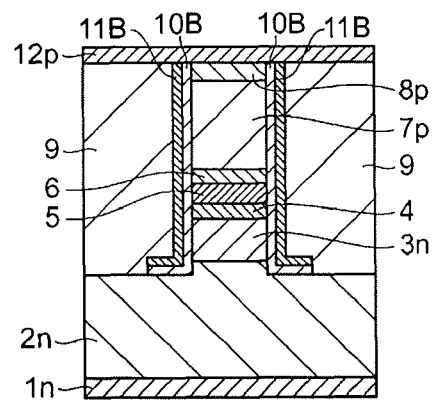

Removing the mask 40, the intermediate layers, 10B and 11B, may be obtained in both sides of the mesa stripe 20A and the portion P on the n-type semiconductor substrate 2n adjacent to the mesa stripe 20A. Subsequently, carrying out the third epitaxial growth of the current blocking layer 9 as the dielectric mask 30 is left for the selective growth; the current blocking layer 9 may bury the mesa stripe 20A and two intermediate layers, 10B and 11B, as shown in FIG. 5D.

Finally, thinning the n-type semiconductor substrate 2n until the thickness thereof is thin enough to cleave the substrate securely and forming the cathode in and the anode 12p on the back surface of the substrate 2n and the p-type contact layer 8p, respectively, the LD 54 with the BH structure as shown in FIG. 4 may be completed.

Thus, the light-emitting device according to the present invention is exemplarily applied to the LD with the Fabry-Perot structure. However, the invention is not restricted to those described as the embodiments. For instance, the invention is applicable to the LD with the distributed feedback (DFB) LD, the distributed Bragg reflector (DBR) structure, and the vertical cavity surface emitting laser (VCSEL). Moreover, the invention is also applicable to the light-emitting diode (LED), the modulator with the electro-absorption (EA) type, the modulator with the Mach-Zender (MZ) type, and the semiconductor optical amplifier (SOA). Applying the layer arrangement of the present invention to those devices, the leak current flowing along both sides of the mesa stripe may be reduced by at least one digit compared with that appeared in the conventional devices, thus, the degradation of the device performance, such as the increase of the threshold current and the decrease of the slope efficiency, may be effectively suppressed.

I claim:

1. A semiconductor light-emitting device, comprising:
   a mesa stripe formed on a semiconductor substrate, said mesa stripe including a first cladding layer, an active layer, and a second cladding layer;
   a current blocking layer provided in both sides of said mesa stripe, said current blocking layer burying said mesa stripe and being doped with an impurity that captures at least one of an electron and a hole; and
   an n-type intermediate layer and a p-type intermediate layer each provided between said mesa stripe and said current blocking layer,
   wherein said p-type intermediate layer comes in directly contact with a side of said mesa stripe, and said n-type intermediate layer is put between said p-type intermediate layer and said current blocking layer.

2. The semiconductor light-emitting device according to claim 1,
   wherein said p-type intermediate layer and said n-type intermediate layer cover a surface of said semiconductor substrate not covered by said mesa stripe.

3. The semiconductor light-emitting device according to claim 1,
   wherein said p-type intermediate layer and said n-type intermediate layer cover a portion of said surface of said semiconductor substrate adjacent to said mesa stripe.

4. The semiconductor light-emitting device according to claim 1,
   wherein said impurity is iron (Fe).

5. The semiconductor light-emitting device according to claim 1,
   wherein said semiconductor substrate, said current blocking layer, said n-type intermediate layer, and said p-type intermediate layer are made of InP.

6. The semiconductor light-emitting device according to claim 1,
   wherein said first cladding layer is an n-type semiconductor layer and said second cladding layer is a p-type semiconductor layer doped with zinc (Zn), and
   wherein said impurity in said current blocking layer is iron (Fe).

7. The semiconductor light-emitting device according to claim 1,
   wherein said first cladding layer is a p-type semiconductor layer doped with zinc (Zn) and said second cladding layer is an n-type semiconductor layer, and
   wherein said impurity in said current blocking layer is iron (Fe).

8. The semiconductor light-emitting device according to claim 1,
   wherein said p-type intermediate layer has a thickness from 50 to 1000 nm.

9. The semiconductor light-emitting device according to claim 8,
   wherein said p-type intermediate layer has a thickness around 200 nm.

10. The semiconductor light-emitting device according to claim 1,
    wherein said mesa stripe further includes first and second optical confinement layers, said first optical confinement layer being put between said first cladding layer and said active layer and said second optical confinement layer being put between said second cladding layer and said active layer.

11. The semiconductor light-emitting device according to claim 10,
    wherein said mesa stripe further includes a contact layer on said second cladding layer.

* * * * *